US012754214B2

(12) United States Patent
Fu et al.

(10) Patent No.: US 12,754,214 B2
(45) Date of Patent: Oct. 6, 2026

(54) RESIDUAL CURRENT DETECTION DEVICE

(71) Applicant: Voltafield Technology Corporation, Jhubei City (TW)

(72) Inventors: Nai-Chung Fu, Jhubei City (TW); Chih-Chao Shih, Jhubei City (TW); Ming-Yu Kuo, Jhubei City (TW)

(73) Assignee: Voltafield Technology Corporation, Jhubei City (TW)

( * ) Notice: Subject to any disclaimer, the term of this patent is extended or adjusted under 35 U.S.C. 154(b) by 141 days.

(21) Appl. No.: 18/422,132

(22) Filed: Jan. 25, 2024

(65) Prior Publication Data

US 2024/0255549 A1 Aug. 1, 2024

(30) Foreign Application Priority Data

Feb. 1, 2023 (TW) ................................ 112103544

(51) Int. Cl.
*G01R 15/20* (2006.01)

(52) U.S. Cl.
CPC .................................. *G01R 15/207* (2013.01)

(58) Field of Classification Search
CPC .... G01R 15/207; G01R 15/205; G01R 31/52; G01R 15/20; G01R 19/00
See application file for complete search history.

(56) References Cited

U.S. PATENT DOCUMENTS

2014/0167750 A1* 6/2014 Akieda ................ G01R 15/202 324/251
2014/0218018 A1* 8/2014 Ivanov ................... G01R 33/09 324/252
2014/0292309 A1* 10/2014 Kurashima .............. G01R 1/22 324/144
2017/0318660 A1* 11/2017 Roan ...................... H05K 1/115
2018/0059148 A1* 3/2018 Geisler ................ G01R 15/202
2020/0057120 A1* 2/2020 Belin ................... G01R 33/096
2021/0003617 A1* 1/2021 Esaka .................. G01R 15/207

FOREIGN PATENT DOCUMENTS

CN 102004203 A * 4/2011
CN 104049129 B * 2/2018 ........... G01R 15/207
KR 102428537 B1 * 8/2022 ........... H01F 27/306

* cited by examiner

*Primary Examiner* — Feba Pothen
(74) *Attorney, Agent, or Firm* — Troutman Pepper Locke LLP; Tim Tingkang Xia, Esq.

(57) ABSTRACT

The present invention provides a residual current detection device comprising a first conductive wire, a second conductive wire, a first magnetic concentrator and a magnetic sensing device wherein the first conductive wire generates a first magnetic field, the second conductive wire is arranged at one side of the first conductive wire for generating a second magnetic field, the first magnetic concentrator is arranged between the first and second conductive wires whereby a highly concentrated magnetic field area is formed between the first and second conductive wires, and the magnetic sensing device is arranged in the highly concentrated magnetic field area for detecting the first and second magnetic fields.

19 Claims, 13 Drawing Sheets

RESIDUAL CURRENT DETECTION DEVICE

CROSS-REFERENCE TO RELATED APPLICATIONS

This application claims the benefit of Taiwan Patent Application Serial No. 112103544, filed on Feb. 1, 2023, the subject matter of which is incorporated herein by reference.

BACKGROUND OF INVENTION

1. Field of the Invention

The present invention relates a residual current detection device, and more particularly, to a residual current detection device for detecting residual current through a homogeneous magnetic field formed between conductive wires having electric current flowing therethrough.

2. Description of the Prior Art

With the development of electrical industry, various types of electronic products are filled in the daily lives of human beings. More particularly, the booming development of electric vehicles and motorcycles in recent years has also driven the growth of charging equipment. Due to the popularity of electronic devices, whether in the process of using or charging electronic devices, they will contact with the human body inevitably. If a leakage of electric current is occurred while using electronic device or charging device, in case of the human body comes into contact inadvertently, the electric current might flow through the human body and reach the ground such that it may cause harm to the human body.

In order to avoid damage caused by leakage, in conventional technology, a residual current detection device (RCD) is used to detect residual current. When the RCD detects residual current, it can immediately cut off the power supply to the circuit for preventing electric shock accidents.

In conventional technology, as shown in FIG. 1, it illustrates schematic diagram of the leakage detection device disclosed in Chinese Patent Publication No. CN102004203A. The commonly used RCD 1 belongs to flux gate type for sensing residual current comprising a ring-shaped magnetic core with hundreds of turns of thin copper wire wound thereon and a metal shield for covering the magnetic core and copper wire thereby avoiding interference from external magnetic fields. The wire 10 to be tested passes through the middle of the magnetic core. When there is no residual current, the summation of all current vectors passing through the core is zero. Based on Ampère's circuital law, it could be known that there is no net magnetic flux in the core at this time. However, if residual current exists, the summation of the electric current vectors will not be zero, and the residual current will result in a variable magnetic flux in the magnetic core at the same time. Furthermore, this variable magnetic flux will cause an induced electromotive force in the magnetic coil (i.e., the thin copper wire wrapped around the magnetic core). Thereafter, a processing circuit processes and analyzes the induced electromotive force in the coil wherein if the analysis results reveal that the electric current residual current is greater than the threshold, the power supply will be cut off by mechanical actuator to initiate the protection function.

Although the conventional RCD can detect the residual current, if it is applied to a condition that the residual current is tens of thousands of times different from the working current, e.g. the 80A working current and 6 mA residual current, the accuracy of tiny residual current detection will be affected due to the interference problem of external magnetic field. In addition, conventional RCDs generally require expensive coils and space-consuming magnetic cores which also increase the cost of the RCDs whereby if the coil and magnetic core are spatially saturated, the operation of RCD would be affected due to the limited sensitivity and accuracy, especially when detecting small residual currents.

Accordingly, there is a need for providing a residual current detection device for solving the problem of the conventional device.

SUMMARY OF THE INVENTION

The present invention provides a residual current detection device, which has a magnetic field concentrator element disposed between conductive wires of electrical device having working current passes therethrough whereby a highly homogeneous magnetic field can be generated, and a magnetic sensor is disposed within this highly homogeneous magnetic field for detecting whether a residual current is occurred in the conductive wires of electronic device or not. Through the design of the present invention, residual current can not only be detected without the conventional configuration of magnetic cores and coils, but also the homogeneous magnetic field generated by the magnetic field concentration unit can be used to reduce the interference of the internal magnetic field, thereby achieving the effects of detecting high frequency and tiny residual current.

The present invention provides a residual current detection device, which can expand the area of a homogeneous magnetic field and improve the detection accuracy of residual current through pairs of magnetic field concentrators. In addition, a shielding structure can be further arranged around the magnetic field concentrator to further achieve the effect of reducing interference generated by external magnetic field.

In one embodiment, the present invention provides a residual current detection device, comprises a first conductive wire, a second conductive wire, a first magnetic field concentrator, and a magnetic sensor wherein the first conductive wire has an electric current flowing therethrough for generating a first magnetic field, the second conductive wire is arranged at one side of the first conductive wire, and has the electric current flowing therethrough for generating a second magnetic field, the first magnetic field concentrator is arranged between the first conductive wire and the second conductive wire for generating a uniform magnetic field area between the first conductive wire and the second conductive wire, and the magnetic sensor is arranged in the uniform magnetic field area for detecting the first magnetic field and the second magnetic field, wherein a flowing direction that the electric current flows in the first conductive wire is the same as a flowing direction that the electric current flows in the second conductive wire, or a vector component of the flowing direction that the electric current flows in the first conductive wire is the same as a vector component of the flowing direction that the electric current flows in the second conductive wire.

In one embodiment, the residual current detection device further comprises a first shielding structure arranged to surround the first conductive wire, the second conductive wire, the first magnetic field concentrator, and the magnetic sensor proximately along the first axial direction and the second axial direction. Alternatively, the residual current detection device further comprises a second shielding structure arranged to surround a peripheral of the first shielding structure proximately along the first axial direction and the second axial direction. Alternatively, in one embodiment, a first shielding structure is arranged to surround the first conductive wire, a second conductive wire, the first magnetic field concentrator, and the magnetic sensor, wherein the magnetic sensor further comprises a first magnetic sensor, and a second magnetic sensor, and a thickness or material of the first shielding structure corresponding to the first magnetic sensor is different from a thickness or material of the first shielding structure corresponding to the second magnetic sensor.

In another embodiment, the residual current detection device further comprises a first magnetic sensor and a second magnetic sensor arranged between the first and the second shield structures for detecting interference magnitude of the external magnetic field, wherein the first magnetic sensor and the second magnetic sensor is arranged at two lateral sides of the magnetic sensor and the interference magnitude of the external magnetic field is deducted for improving the accuracy of detection.

In one embodiment for reducing the interference of external magnetic field, the first conductive wire further comprises a first sub conductive wire and a second conductive wire, the second conductive wire further comprises a third sub conductive wire and a fourth sub conductive wire, and the magnetic sensor further comprises a first magnetic sensor and a second magnetic sensor for detecting magnetic field along the second axial direction wherein the first magnetic sensor is arranged between the first sub conductive wire and the second sub conductive wire, the second magnetic sensor is arranged between the third sub conductive wire and the fourth sub conductive wire, the first sub conductive wire is electrically coupled to the third sub conductive wire, and the second sub conductive wire is electrically coupled to the fourth sub conductive wire for shielding interference of external magnetic field.

In one embodiment, the residual current detection device further comprises a third conductive wire and a fourth conductive wire for multiple conductive wires application, such as three-phase with four conductive wires, there-phase with three conductive wires, for example.

In one embodiment, the magnetic sensor further detect different range of residual current, in which the first magnetic sensor is integrated into a first chip, and a second magnetic sensor is integrated into a second chip, wherein the first and second chips are respectively corresponding to different measuring range of the residual current.

BRIEF DESCRIPTION OF THE DRAWINGS

The present invention will now be specified with reference to its preferred embodiment illustrated in the drawings, in which.

DESCRIPTION OF THE PREFERRED EMBODIMENT

Figure 1:
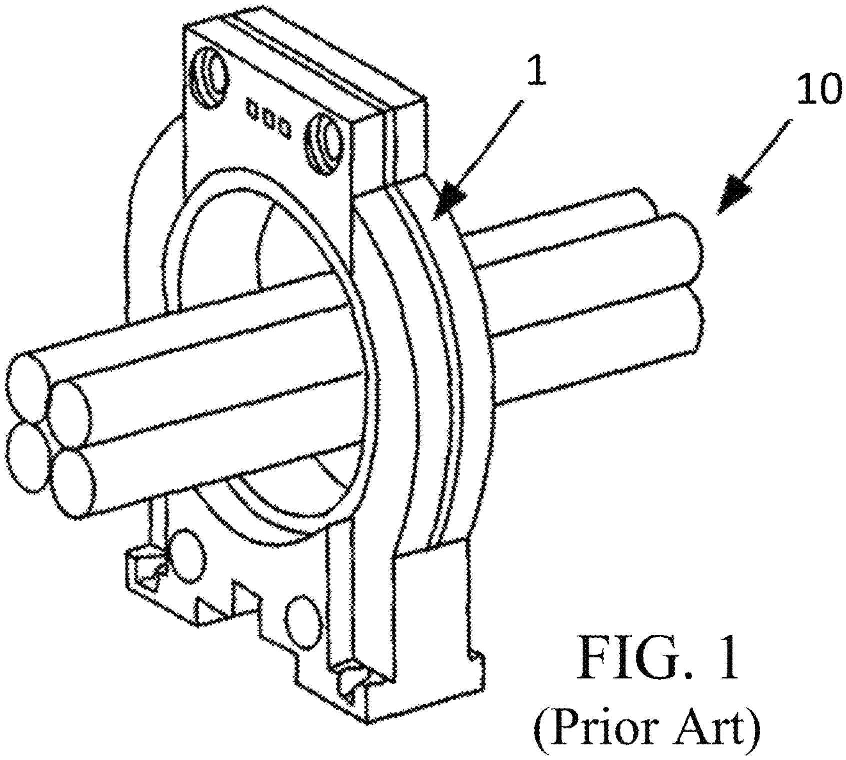
FIG. 1 (Prior Art)
FIG. 1 illustrates a conventional residual current detection device.

The invention disclosed herein is directed to residual current detection device. In the following description, numerous details corresponding to the aforesaid drawings are set forth in order to provide a thorough understanding of the present invention so that the present invention can be appreciated by one skilled in the art, wherein like numerals refer to the same or the like parts throughout.

It is noted that when introducing elements of the examples disclosed herein, the term "a," "an," and "the" are intended to mean that there are one or more of the elements. The terms "comprise or comprising", "include or including", "have or having", and "contain or containing" are intended to be open ended and mean that there may be additional elements other than the listed elements. In addition, the phrase "and/or," as used herein in the specification and in the claims, should be interpreted as the any one or combination of at least one, or a number of listed embodiments.

Although the terms first, second, etc. may be used herein to describe various elements, components, modules, and/or zones, these elements, components, modules, and/or zones should not be limited by these terms. Various embodiments will now be described in conjunction with a number of schematic illustrations. The embodiments which are set forth the device for cultivating cells and method for making the same are different from the conventional approaches. Various embodiments of the application may be embodied in many different forms and should not be construed as a limitation to the embodiments set forth herein.

In the present specification, the magnetic field sensing layer and the magnetoresistive layer can be respectively made of or made from magnetic material whose electric resistance is particularly capable of being varied with respect to the variation of the external magnetic field. Each magnetic field sensing layer or the magnetoresistive layer can be a single film, multiple discrete films or multiple continuously overlapped films, such as the anisotropic magnetoresistance (AMR), giant magnetoresistance (GMR), and tunneling magnetoresistance (TMR), for example. The magnetic material further comprises ferromagnet material, anti-ferromagnet material, non-ferromagnet material, tunneling oxide material or the combination of thereof. Preferably, the magnetic field sensing layer or magnetoresistive layer is referred to the AMR, and more particularly, to the permalloy made AMR. In the present specification, the adjustives "sensing" added before components or elements is used to describe the function or effect of these components when the magnetoresistive sensing element is utilized to detect a magnetic field with respect to a specific direction. When the direction of the sensed magnetic field is changed (e.g. reversed direction), the functions or effects of these components or elements may be varied or be interchanged. Therefore, adjectives such as "sensing" that are placed before components should not limit the function or effect of those components. In the present specification, the "electrically coupled" of A and B parts means that electric current can flow from one of the A and B to the other; therefore the "electrically coupled" of A and B parts can mean that A and B are in physical contact, or having one or more conductive structures/substances are arranged between A and B for allowing A and B electrically communicating with each other.

Figure 2A:
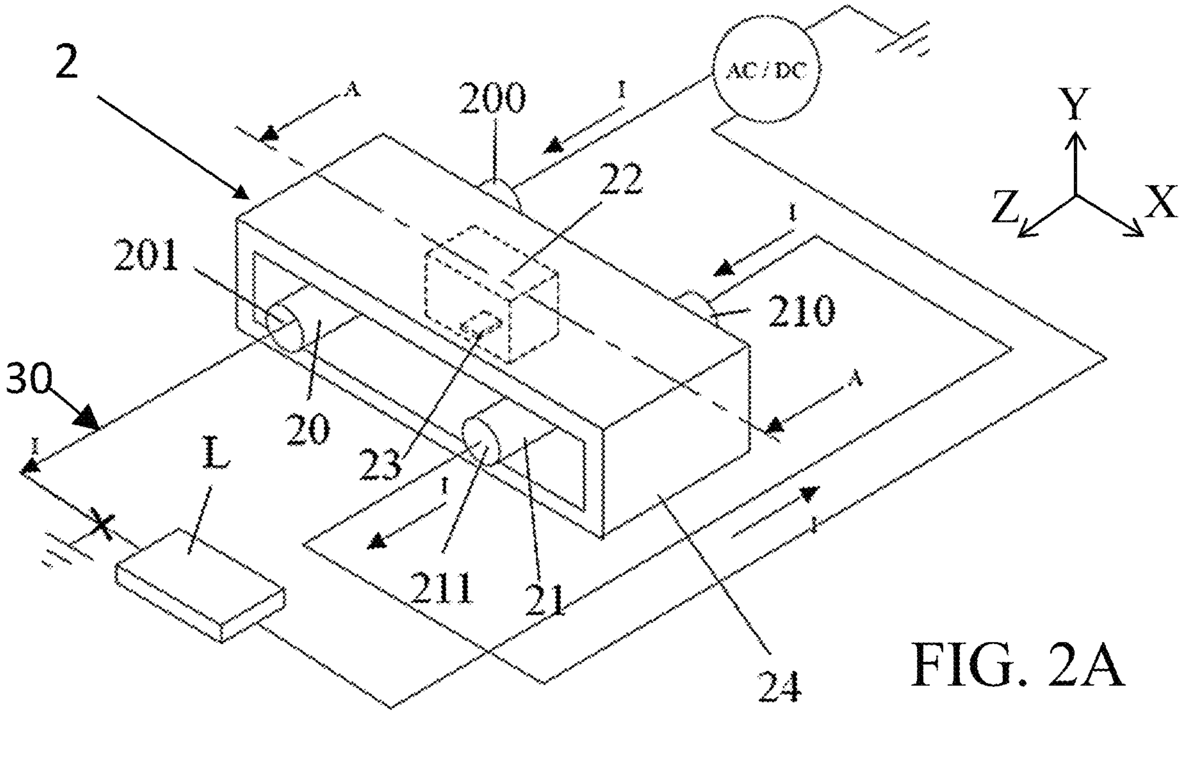
FIG. 2A illustrates a perspective view of the residual current detection device according to one embodiment of the present invention.
Figure 2B:
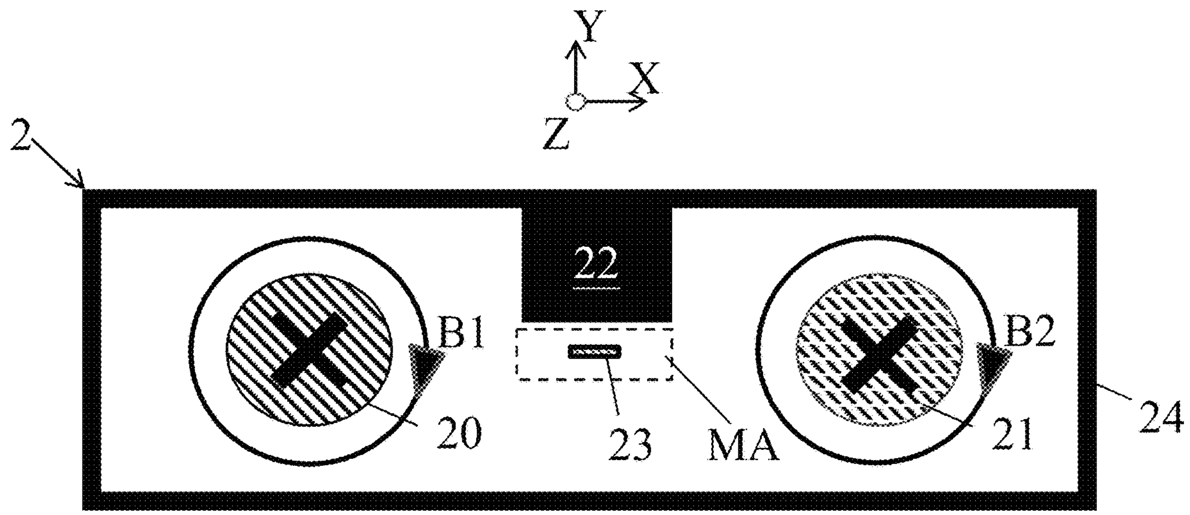
FIG. 2B illustrates a AA cross-sectional view of the residual current detection device shown in FIG. 2A.

Please refer to FIG. 2A and FIG. 2B, wherein FIG. 2A is a three-dimensional schematic diagram of an embodiment of the residual current detection device according to the present invention. FIG. 2B is AA cross-sectional schematic view of the residual current detection device shown in FIG. 2A. The residual current detection device 2 in this embodiment can be utilized to detect residual currents ranging from tens of thousands to one hundred thousand times or less of the operating electric current of the electric device. The electronic device may be any form of electronic device, such as household electronic device or charging device, e.g. charging pillar of electric vehicle and facilities arranged in the charging station for electric vehicle.

In the embodiment shown in FIG. 2A, the residual current detection device 2 comprises a first conductive wire 20, a second conductive wire 21 disposed on one side of the first conductive wire 20, a first magnetic field concentrator 22 and a magnetic sensor 23. The first end 200 of the first conductive wire 20 is electrically coupled to the circuit loop 30 of the electronic device. The circuit loop 30 is electrically coupled to the load L and the power supply AC/DC, wherein the electric current I provided by the power supply AC/DC to the circuit loop 30 flows into the first conductive wire 20 through the first end 200 of the first conductive wire 20 so as to generate a first magnetic field B1. The circuit loop 30 is electrically coupled to the second end 201 of the first conductive wire 20. In the present embodiment, load L is electrically coupled to the circuit loop 30, the electric current I enters the load L and flows out of the load L. The load L is also electrically coupled to the first end 210 of the second conductive wire 21 through the circuit loop 30, while the second end 211 of the second conductive wire 21 is electrically coupled to the power supply AC/DC through the circuit loop 30. The electric current I flows out of the load L and then enters the second conductive wire 21 thereby generating a second magnetic field B2. In the present embodiment, since the flowing direction of electric current I in the first conductive wire 20 is the same as the flowing direction of electric current I in the second conductive wire 21, a net magnetic field (B1-B2) can be obtained. When the net magnetic field (B1-B2) is equal to zero, there is no residual current in the electric current loop; however, when the net magnetic field (B1-B2) is not equal to zero, there is residual current occurred. Alternatively, in another embodiment, if the electrical current in each conductive wire 20 and 21 is not parallel like the embodiment shown in FIG. 2A, a vector component, e.g. along the third axial direction (Z), of the flowing direction that the electric current flows in the first conductive wire 20 is the same as a vector component, e.g. along the third axial direction (Z), of the flowing direction that the electric current flows in the second conductive wire 21 can be also implemented.

The first magnetic field concentrator 22 is arranged between the first conductive wire 20 and the second conductive wire 21 for rearrange the distribution of magnetic field such that an area MA having highly homogeneous magnetic field can be generated between the first and the second magnetic fields B1 and B2. In the present embodiment, the first magnetic field concentrator 22 is formed by a magnetic material and there has no particular limitation on the shape and forming method of the first magnetic field concentrator 22. It is noted that if the first magnetic field concentrator 22 is not arranged, the measurable area, i.e. the area along the X direction shown in FIG. 2B, with respect to the magnetic field generated by the first conductive wire 20 and the second conductive wire 21 will be very narrow. Therefore, when the varied ratio of the magnetic field is very small, and the spatial gradient of the magnetic field becomes larger such that the magnetic sensor 23 is difficult to measure the difference of the first magnetic field B1 and the second magnetic field B2. Accordingly, the measurable area along the X direction is expanded through arranging the first magnetic field concentrator 22 arranged between the first conductive wire 20 and the second conductive wire 21 whereby a tiny residual current, e.g. 6 mA or 20 mA, could be effectively detected within the magnetic field formed between first conductive wire 20 and second conductive wire 21 having large operating current, e.g. 30A~80A.

In one embodiment, the first conductive wire 20 and the second conductive wire 21 take the first magnetic field concentrator 22 as a symmetry center, and are symmetrically or nearly symmetrically arranged at the two lateral sides of the first magnetic field concentrator 22. When the electric current I flowing through the first and second conductive wires 20 and 21, the magnetic sensor 23 arranged at the area MA can detect the difference between the first and the second magnetic fields B1 and B2 whereby the residual current can be determined. It is noted that the calculation for determining the residual current according to the difference between two magnetic fields is well-known by the one having ordinary skills in the art, so it would not be described hereinafter. The magnetic sensor 23 can be, but should not be limited to, Hall sensor, magnetoresistance sensor, such as giant magnetoresistance (GMR) sensor and anisotropic magnetoresistance (AMR), for example, or a combination of Hall sensor or magnetoresistance sensor.

Figure 2C:
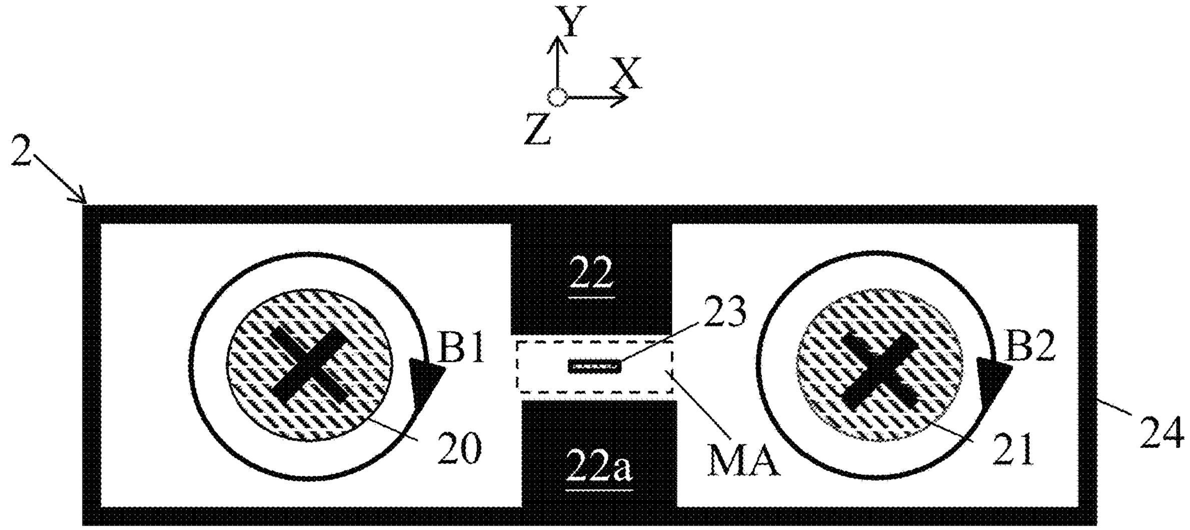
FIG. 2C illustrates a residual current detection device according to another embodiment of the present invention.

Alternatively, in one embodiment shown in FIG. 2C, the residual current detection device 2 further comprises a second magnetic field concentrator 22*a* arranged at one side of the magnetic sensor 23 such that the magnetic sensor 23 is arranged between the first and the second magnetic field concentrators 22 and 22*a*. Through the arrangement shown in FIG. 2C, the area MA having highly homogeneous magnetic field can be further expanded, whereby the difference between the first and second magnetic fields B1 and B2 could be further increased thereby effectively improving the accuracy of the residual current detection. In addition, in the embodiments shown in FIG. 2B and FIG. 2C, the residual current detection device 2 further comprises a shielding structure 24 for preventing the area MA from being interfered by the external magnetic field. It is noted that there are many kinds of shielding structures that could be utilized in the embodiment shown in FIG. 2B and FIG. 2C. In the cross-sectional view shown in the embodiments of FIG. 2B and FIG. 2C, a first shielding structure 24 is arranged to surround the first conductive wire 20, the second conductive wire 21, the first magnetic field concentrator 22 and magnetic sensor 23 proximately along the first axial direction (X) and the second axial direction (Y) so as to prevent the interference of external magnetic field thereby improving the accuracy of the residual current detection device 2.

Figure 2D:
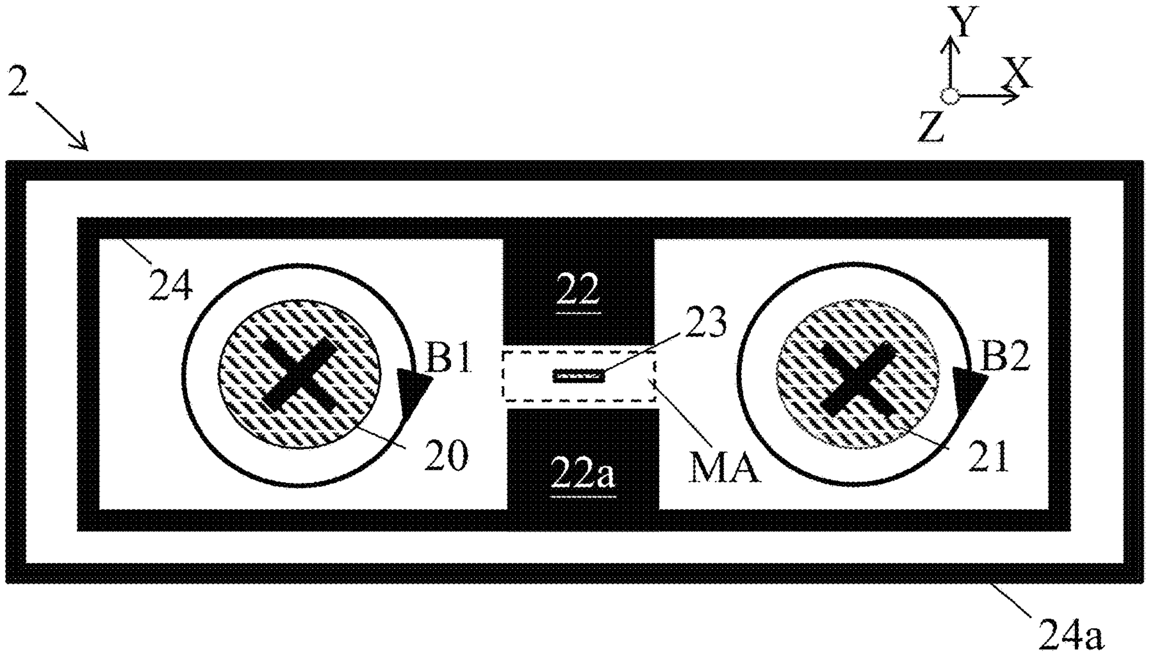
FIG. 2D to FIG. 2F respectively illustrates different shielding structure according to different embodiments of the present invention.
Figure 2E:
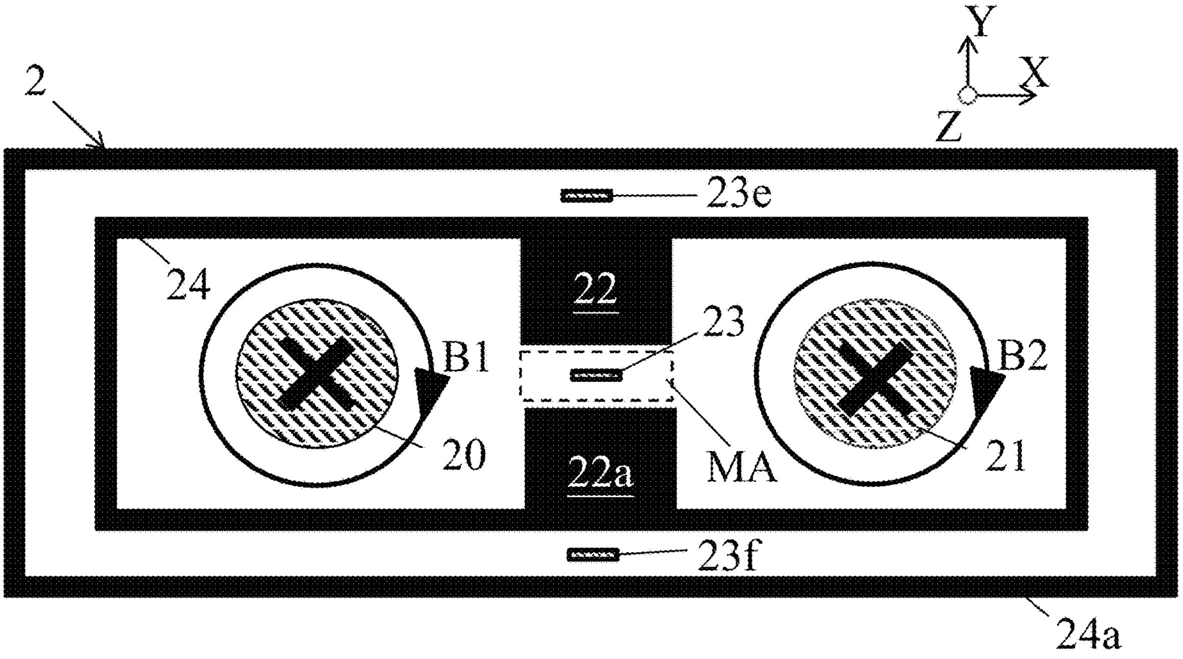
Figure 2F:
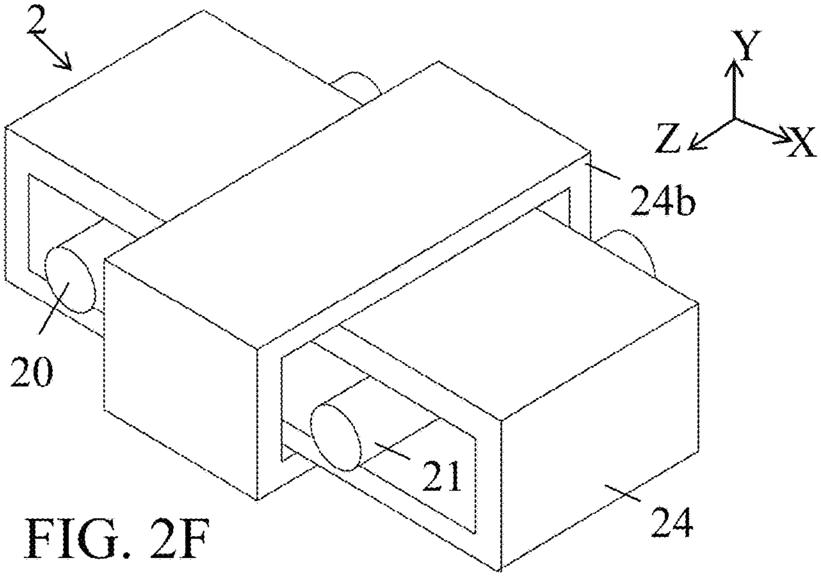

Alternatively, in another embodiment shown in FIG. 2D, the residual current detection device 2 is basically similar to the embodiment shown in FIG. 2C, and the different part is that a second shielding structure 24*a* is further utilized to surround the peripheral of the first shielding structure 24 along the first axial direction (X) and the second axial direction (Y). In the embodiment shown in FIG. 2E, it is basically similar to the embodiment shown in FIG. 2D, and the different part is magnetic sensors 23*e* and 23*f* are further arranged between the first shielding structure 24 and the second shielding structure 24*a* wherein the magnetic sensors 23*e* and 23*f* are arranged along the second axial direction (Y), and are separately arranged at two lateral sides of the magnetic sensor 23. In this embodiment, the magnetic sensors 23*e* and 23*f* are utilized to detect the interference magnitude of the external magnetic field forming a natural gradient distribution between the two magnetic sensors 23*e* and 23*f*. Moreover, the shielding structures 24 and 24*a* forms a constant magnetic field decaying proportion such that the external magnetic field could be deducted by the residual current detection device 2 thereby improving the accuracy of residual current detection. In the embodiment shown in FIG. 2F, it is basically similar to the embodiment shown in FIG. 2C, and the different part is that a third shielding structure 24*b* is arranged to surround the peripheral of the first shielding structure 24 proximately along the second axial direction (Y) and the third axial direction (Z).

Figure 3A:
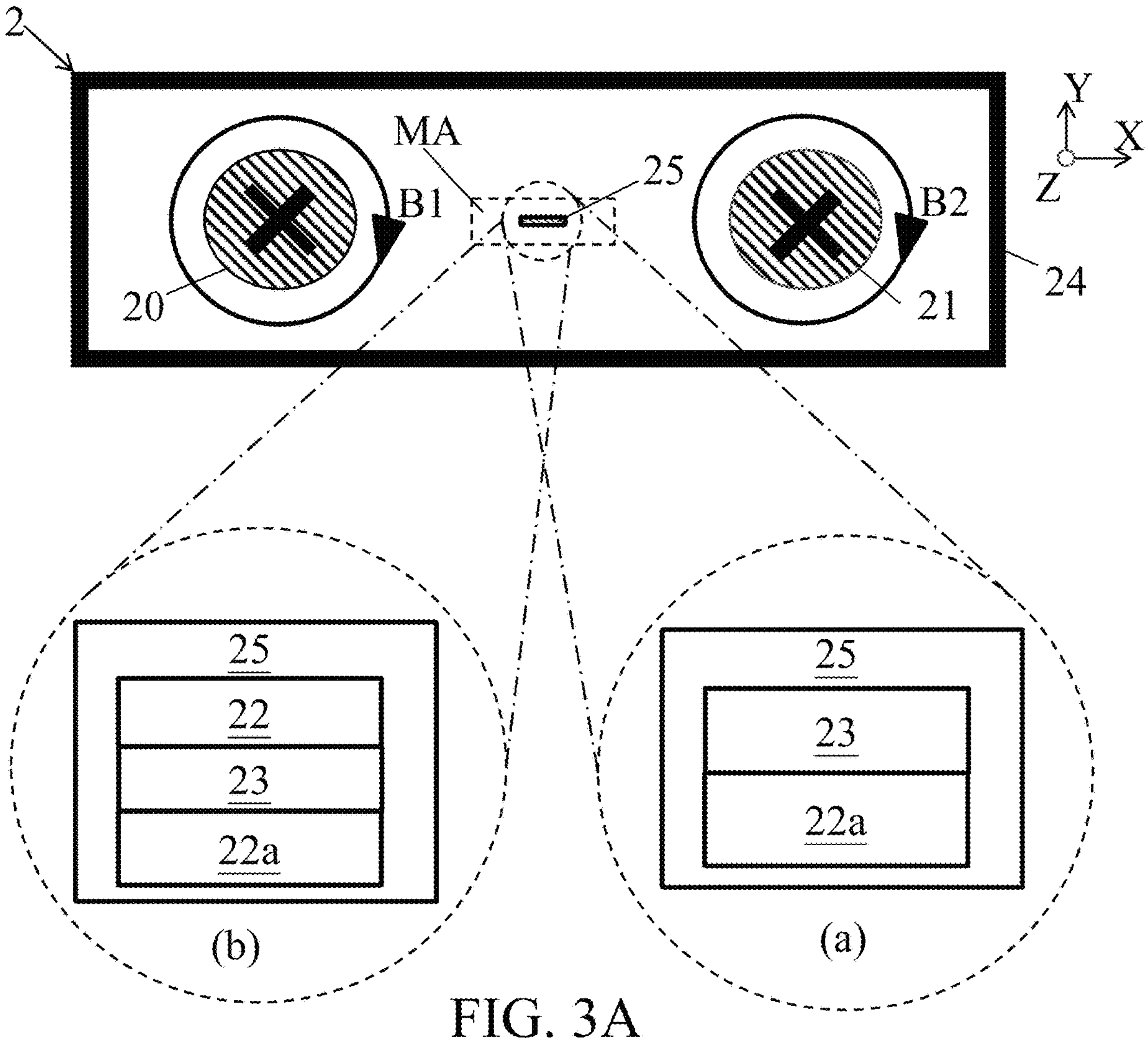
FIG. 3A illustrates a residual current detection device according to another embodiment of the present invention.
Figure 3B:
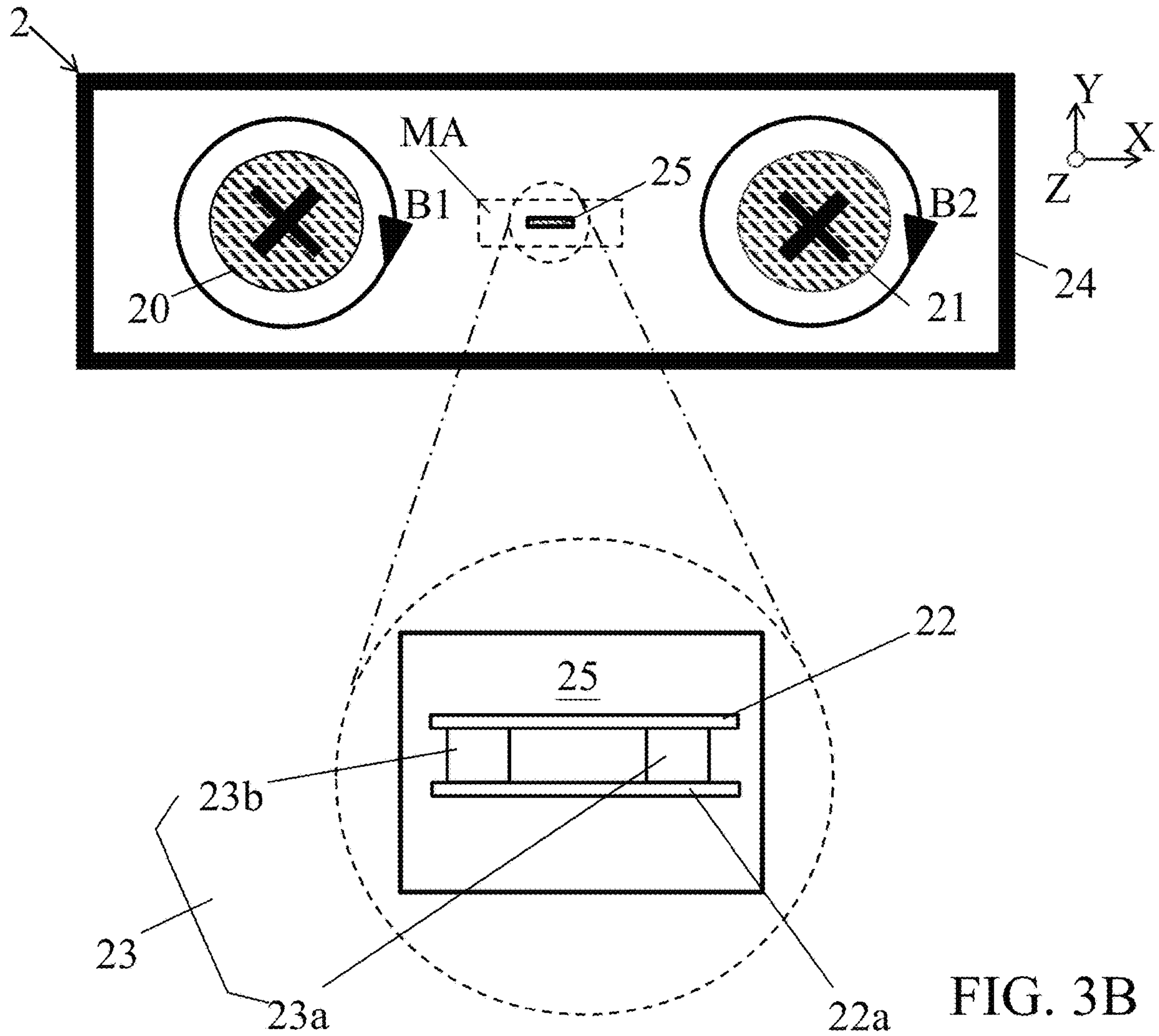
FIG. 3B and FIG. 3C illustrates residual current detection device having a plurality of magnetic sensors according to another embodiment of the present invention.

Please refer to FIG. 3A, which illustrates residual current detection device according to another embodiment of the present invention. In the embodiment shown in FIG. 3A(a), it is basically similar to the embodiment shown in FIG. 2B, and the different part is that the magnetic sensor 23 and the first magnetic field concentrator 22 are integrated into the magnetic sensing chip 25. Alternatively, in the embodiment shown in FIG. 3A(b), the second magnetic field concentrator 22*a* is further disposed such that the magnetic sensor 23 is arranged between the first and second magnetic field concentrators 22 and 22*a*. It is noted that the quantity of the magnetic sensor 23 that is integrated into the magnetic sensing chip 25 is not limited to single one. For example, in the embodiment shown in FIG. 3B, the magnetic sensor 23 further comprises a first magnetic sensor 23*a* and the second magnetic sensor 23*b*, and the first and second magnetic field concentrators 22 and 22*a* are arranged at two lateral sides of the first magnetic sensor 23*a* and the second magnetic sensor 23*b*, respectively, e.g. along the second axial direction (Y). It is noted that since there might be a position inaccuracy occurred when the first magnetic sensor 23 is centrally arranged between the first and second conductive wires 20 and 21; therefore, in this embodiment, the position inaccuracy or manufacturing inaccuracy for the single magnetic sensor shown in FIG. 2B and FIG. 2C could be compensated by arranging the first and second magnetic sensors 23*a* and 23*b* between the first and second conductive wires 20 and 21 whereby the accuracy of residual current detection could be further improved.

Figure 3C:
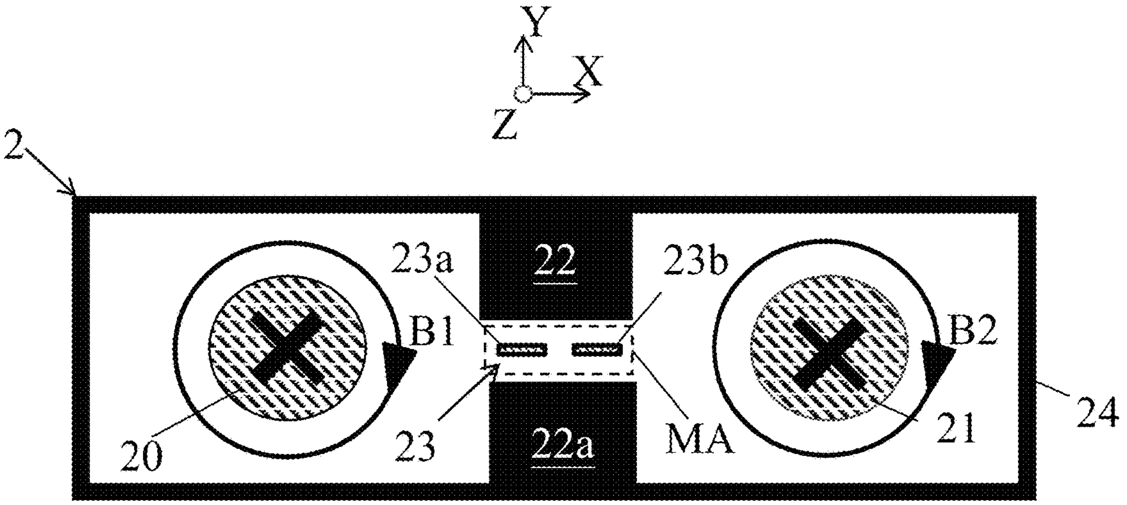
Figure 3D:
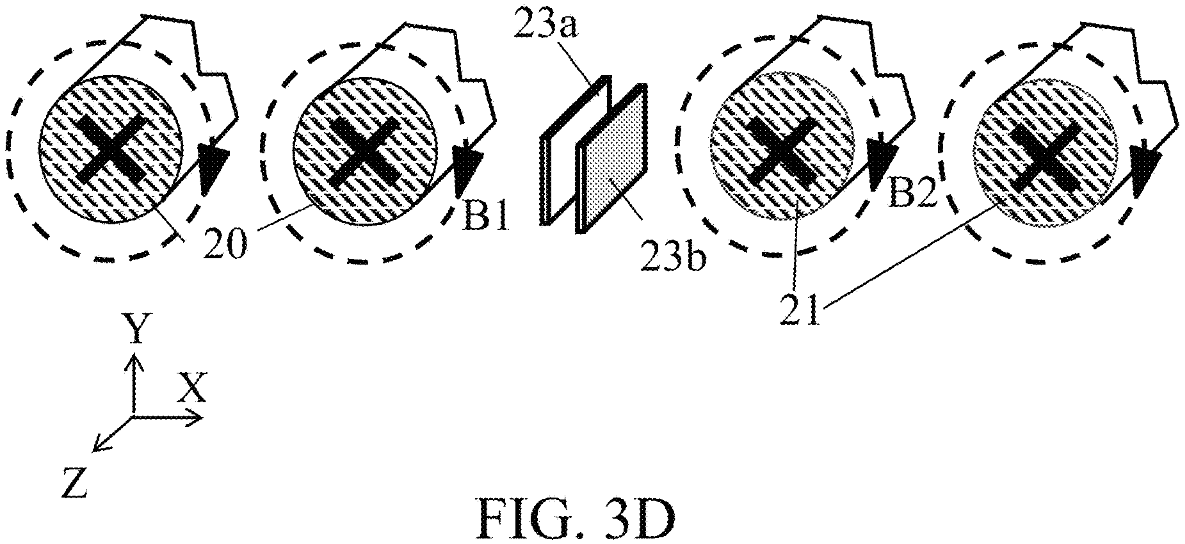
FIG. 3D illustrates arrangement of the first magnetic sensor and the second magnetic sensor according to one embodiment of the present invention.

Alternatively, in the embodiment shown in FIG. 3C, the first magnetic sensor 23*a* and the second magnetic sensor 23*b* are independent from each other and are arranged in the area MA having highly homogeneous magnetic field with a specific distance away from each other along the first axial direction (X). Furthermore, in another embodiment shown in FIG. 3D, which illustrates arrangement of the first and second magnetic sensors according to another embodiment of the present invention. In the present embodiment, the first and second magnetic sensors 23*a* and 23*b* are independent from each other, wherein the different part from the embodiment shown in FIG. 3C is that the first and second magnetic sensors 23*a* and 23*b* are facing to each other with a specific distance away from each other such that small area MA having highly homogeneous magnetic field is sufficient and the manufacturing tolerance could be increased at the same time. Therefore, the arrangement as well as the quantity of the magnetic sensor would not be the limitation of the present invention. Moreover, the conductive wires shown in the embodiments of the present invention are arranged parallelly along first axial direction (X); however, it could also be wound horizontally for enhancing the magnitude of the magnetic field. Alternatively, the conductive wire could also be arranged or wound vertically, i.e. arranged along the Y direction shown in FIG. 2A. Therefore, the number of windings and the arrangement would not be the limitation of the present invention.

Figure 4A:
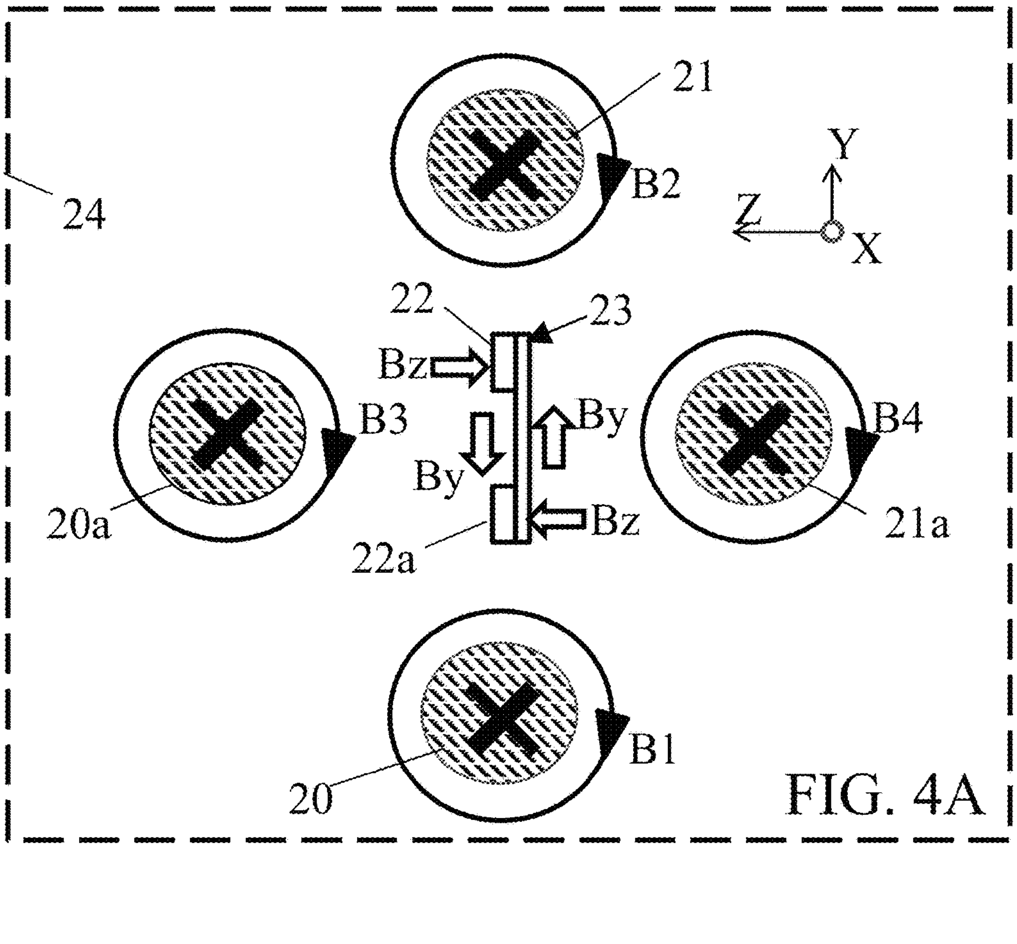
FIG. 4A illustrates residual current detection device having two different detecting range according to one embodiment of the present invention.
Figure 4B:
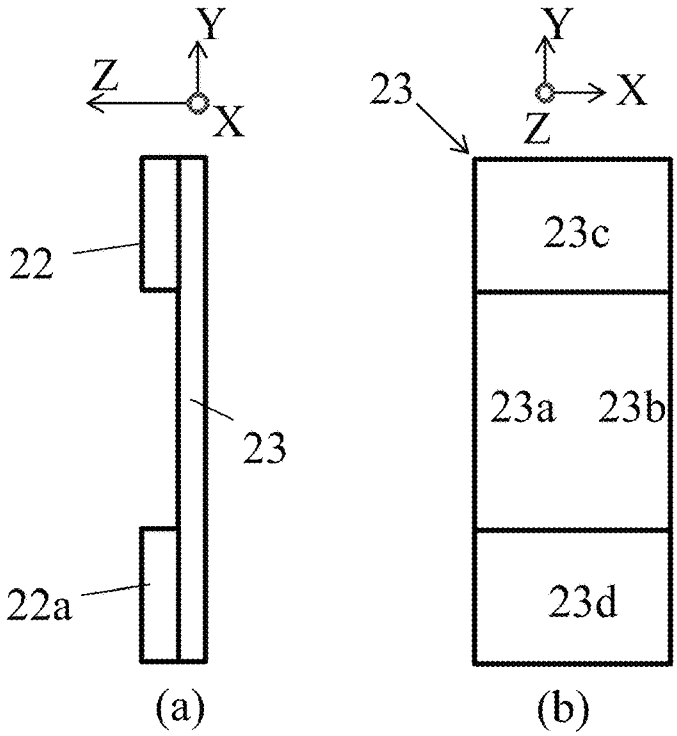
FIG. 4B illustrates residual current detection device having capability for detecting two different axial direction according to one embodiment of the present invention.

Please refer to FIG. 4A and FIG. 4B, which illustrates residual current detection device according to another embodiment of the present invention, wherein the FIG. 4A illustrates the relationship between the residual current detection device and conductive wires, and FIG. 4B (a) and (b) illustrates the view of residual current detection device along different axial directions. In the present embodiment, the magnetic sensors having different sensing field range are integrated into a single chip wherein the first type of magnetic sensor comprises a first magnetic sensor 23*a* and the second magnetic sensor 23*b* having smaller sensing field range with highly accuracy at the second axial direction (Y), while the second type of magnetic sensor comprises a third magnetic sensor 23*c* and the fourth magnetic sensor 23*d* having larger sensing field range at the second third direction (Z). The first magnetic field B1 generated by the first conductive wire 20 and the second magnetic field B2 generated by the second conductive wire 21 will induce a net magnetic field B1-B2 such that the third magnetic sensor 23*c* and fourth magnetic sensor 23*d* could detect the variation of magnetic field Bz within the area having the net magnetic field (B1-B2). Likewise, the third magnetic field B3 generated by the third wire 20*a* and the fourth magnetic field B4 generated by the fourth wire 21*a* will induce a net magnetic field B3-B4 such that the third magnetic sensor 23*c* and fourth magnetic sensor 23*d* could detect the variation of magnetic field By within the area having the net magnetic field (B3-B4). It is noted that, in the present embodiment, the first to fourth magnetic sensors 23*a*~23*d* of the magnetic sensor 23 are arranged in pairs which has the same effect as the embodiment shown in FIG. 3B. The pairing arrangement could solve the problem caused by single magnetic sensor or solve the issue of the manufacturing tolerance thereby improving the accuracy of residual current detection. It is noted that the plurality of paring magnetic sensors could be integrated into single chip or separately arranged and there is no specific limitation on the paring arrangement of the magnetic sensors.

It is noted that, in the present embodiment, the magnetic sensor 23 having first to fourth magnetic sensors 23*a*~23*d* are integrated into a chip package, and the first and the second magnetic field concentrators 22 and 22*a* are integrated into the chip package through semiconductor manufacturing process. Alternatively. The first and second magnetic field concentrators 22 and 22*a* can be separately arranged from the magnetic sensor 23, e.g., the arrangement shown in FIG. 2B and FIG. 2C. In the present embodiment, the first shielding structure 24 is arranged to surround the first and second conductive wires 20 and 21 and the third and fourth wires 20*a* and 21*a*.

Figure 4C:
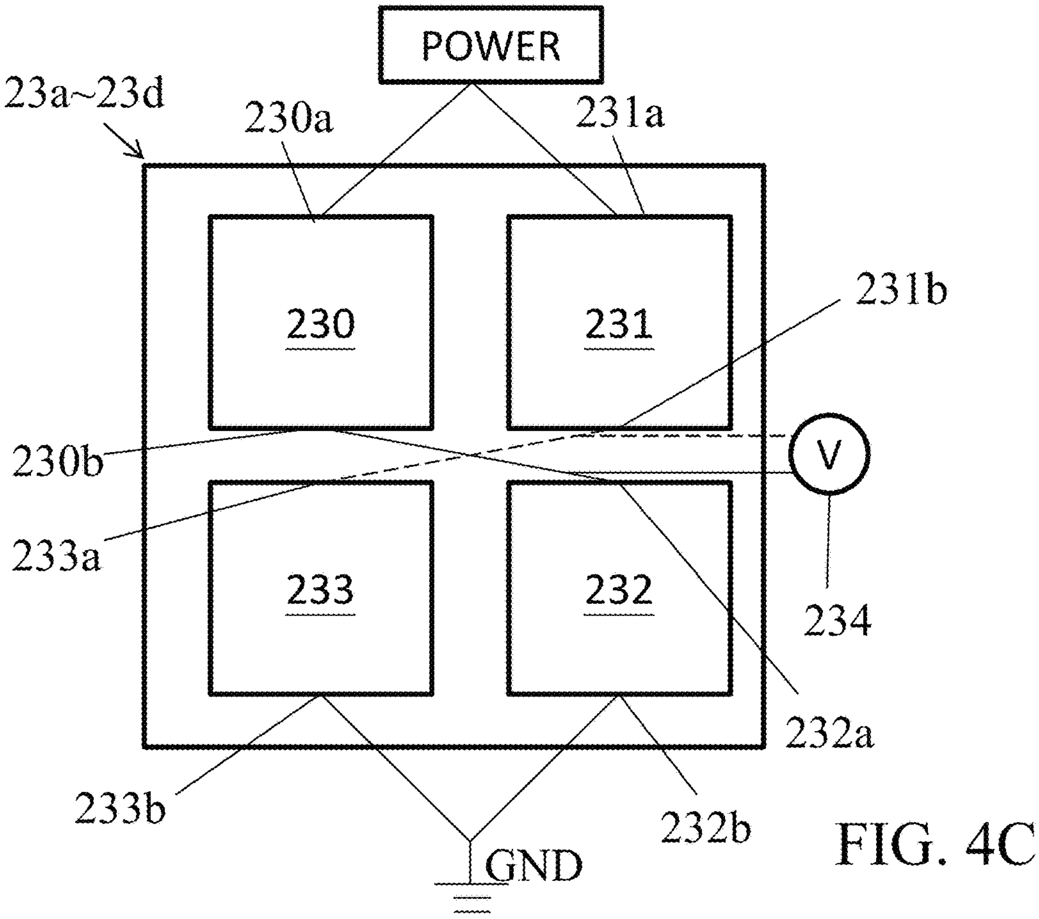
FIG. 4C illustrates a relationship of the magnetoresistance elements and Wheatstone bridge arranged inside each magnetic sensors.

Please refer to embodiment shown in FIG. 4C which illustrates layout of Wheatstone bridge formed by magnetoresistance elements arranged inside each first to fourth magnetic sensors 23*a*~23*d*. Each magnetic sensor 23*a*~23*d* comprises a first magnetoresistance sensing element 230, a second magnetoresistance sensing element 231, a third magnetoresistance sensing element 232, and a fourth magnetoresistance sensing element 233 that are constructed the Wheatstone bridge arrangement. In the present embodiment, a first end 230*a* of the first magnetoresistance sensing element 230 and a first end 231*a* of the second magnetoresistance sensing element 231 are electrically coupled to the power source while the third magnetoresistance sensing element 232 and the fourth magnetoresistance sensing element 233 are arranged in pair at one side of the first and second magnetoresistance sensing elements 230 and 231 whereby a first end 232*a* of the third magnetoresistance sensing element 232 is corresponding to a second end 231*b* of the second magnetoresistance sensing element 231, and a first end 233*a* of the fourth magnetoresistance sensing element 233 is corresponding to a second end 230*b* of the first magnetoresistance sensing element 230. The second ends 232*b* and 233*b* of the third and fourth magnetoresistance sensing element 232 and 233 are electrically coupled to the ground end (GND), and a first end the voltage detecting unit 234 is electrically coupled to the second end 231*b* of the second magnetoresistance sensing element 231 and the first end 233*a* of the fourth magnetoresistance sensing element 233, while a second end of the voltage detecting unit 234 is electrically coupled to the second end 230*b* of the first magnetoresistance sensing element 230 and the first end 232*a* of the third magnetoresistance sensing element 232. In the embodiment shown in FIG. 4C, the sensing accuracy of the application range could be increased.

Figure 4D:
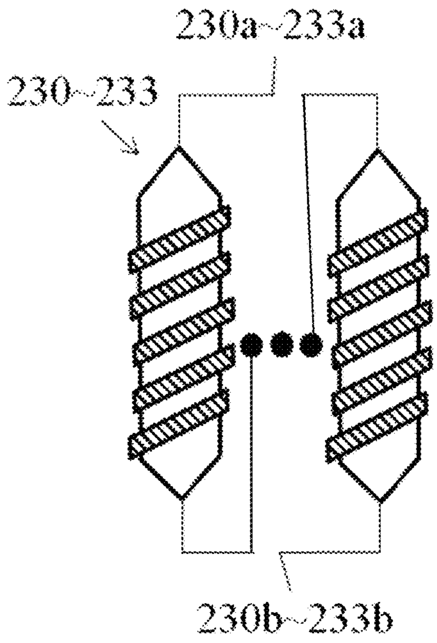
FIG. 4D and FIG. 4E respectively illustrate different magnetoresistance elements of the present invention.
Figure 4E:
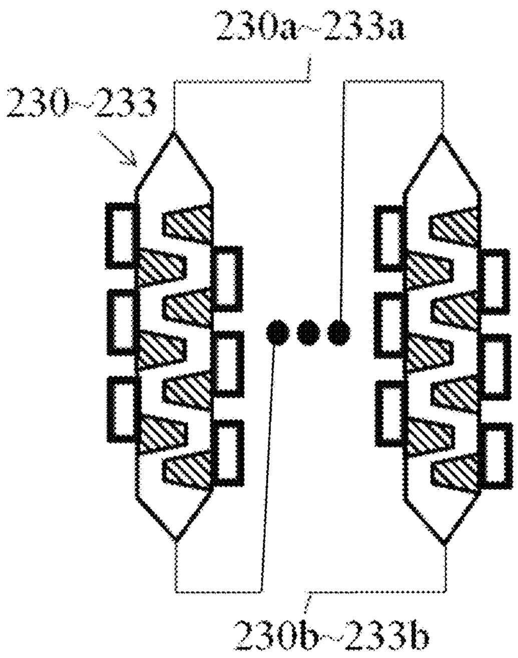

It is noted that, in the embodiment shown in FIG. 4B for detecting the magnetic field along the second axial direction (Y), the first to fourth magnetoresistance sensing elements 230~233 in each magnetic sensors 23*a* and 23*b* are illustrated as the embodiments shown in FIG. 4D, which comprises single magnetoresistance sensing element or a plurality of magnetoresistance sensing elements serially connected to each other. The magnetic field along the third axial direction (Z) is detected by the third and fourth magnetic sensors 23*c* and 23*d* and the first to fourth magnetoresistance sensing elements 230~233 in each magnetic sensors 23*c* and 23*d* are illustrated as the embodiments shown in FIG. 4E, which comprises a plurality of magnetoresistance sensing elements serially connected to each other.

Figure 5:
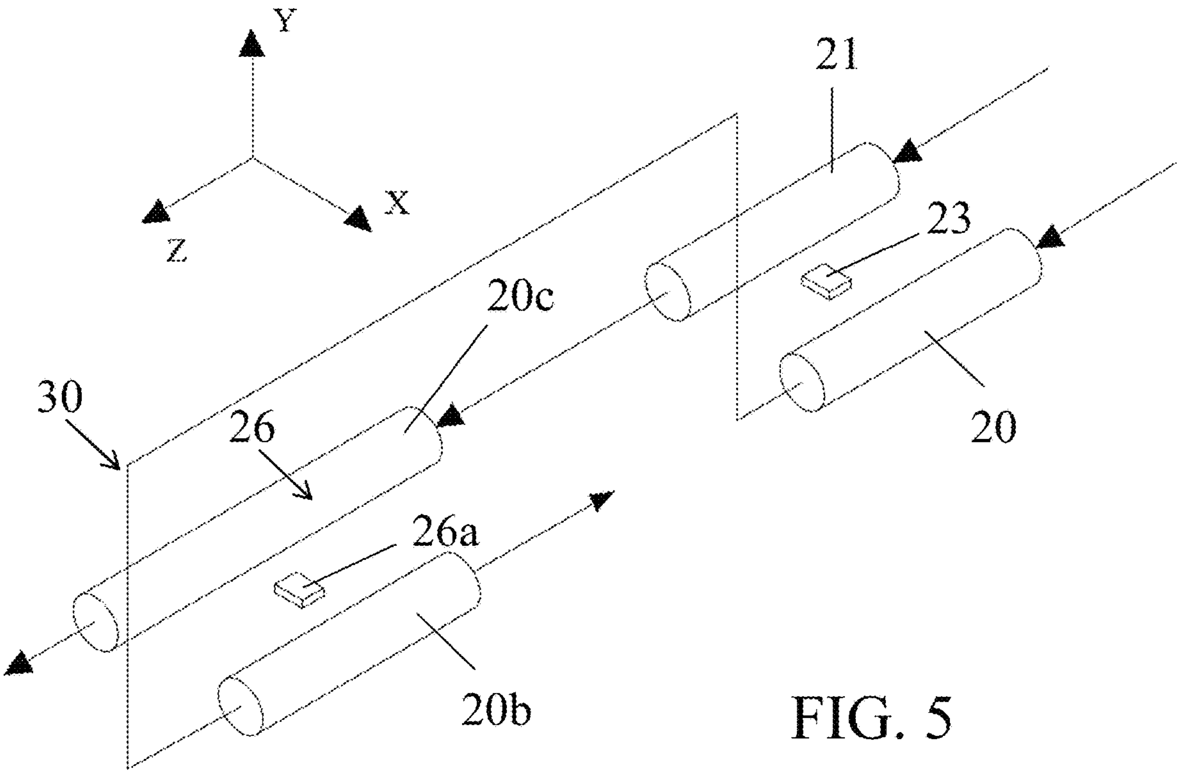
FIG. 5 illustrates residual current detection device according to another embodiment of the present invention.

Please refer to FIG. 5, which illustrates residual current detection device according to another embodiment of the present invention. In the present embodiment, the residual current detection device further comprises a current detector 26 for detecting the electric current in the conductive wire. In the circuit loop 30 of the electronic device, the direction of the electric current flow in the first and second conductive wires 20 and 21 is the same as each other. The magnetic sensor 23 is arranged between the first and second conductive wires 20 and 21. It is noted that the arrangement is similar to the previously-described embodiments, and it will not be described hereinafter. In the present embodiment, the circuit loop 30 further comprises a fifth wire 20*b* and the sixth wire 20*c*, wherein the first conductive wire 20 is electrically coupled to the fifth wire 20*b*, the second conductive wire 21 is electrically coupled to the sixth wire 20*c*, and the direction of the electric current in the fifth wire 20*b* is opposite to the direction of the electric current in the sixth wire 20*c*. In the present embodiment, the fifth wire 20*b* arranged at one side of the sixth wire 20*c* is utilized to generate fifth magnetic field, and the six wire 20*c* is utilized to generate sixth magnetic field. A magnetic field sensor 26*a* is arranged within the intersection area of the fifth magnetic field and the sixth magnetic field between the fifth wire 20*b* and sixth wire 20*c* for detecting the fifth magnetic field and the sixth magnetic field. The magnitude of electric current could be determined according to the detected fifth and sixth magnetic fields. It is noted that the way for determining the electric current in the conductive wire according to the difference and summation is well-known by the one having ordinary skilled in the art, and it will not be described hereinafter.

Figure 6A:
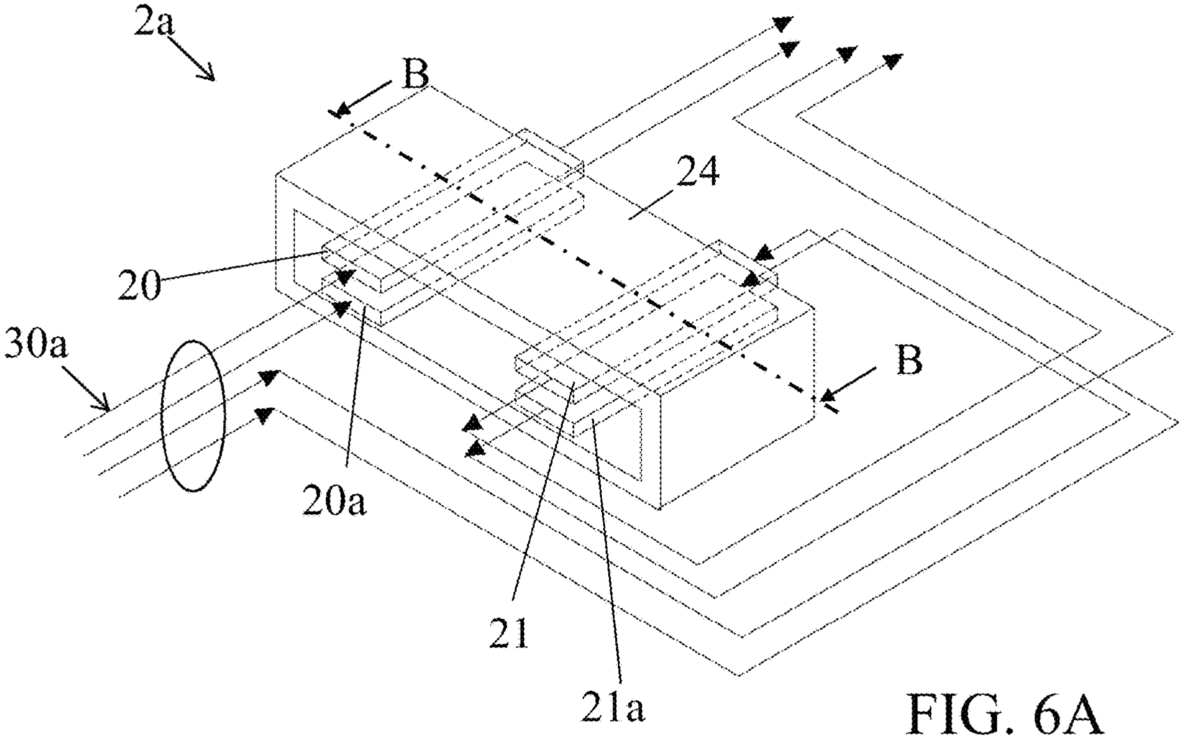
FIG. 6A and FIG. 6B respectively illustrate residual current detection device and BB cross-sectional view according to another embodiment of the present invention.
Figure 6B:
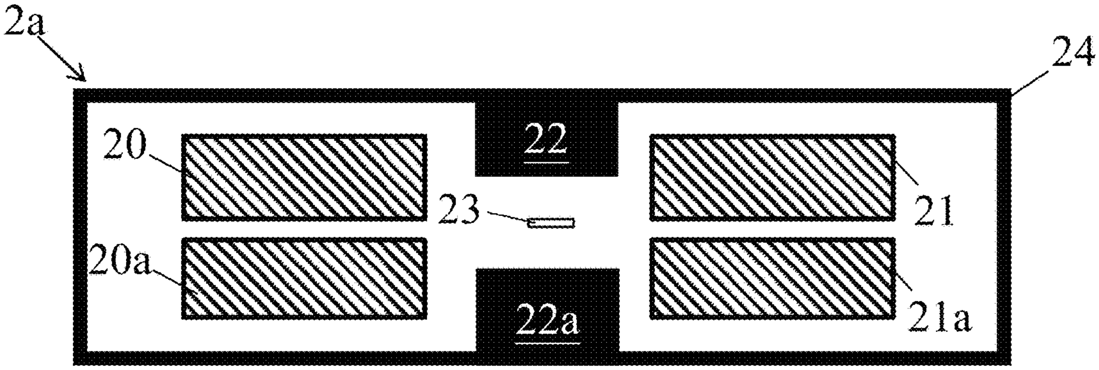

Please refer to FIG. 6A and FIG. 6B, which illustrates a perspective view and BB cross-sectional view of the residual current detection device according to one embodiment, respectively. In the present embodiment, the residual current detection device 2*a* is utilized to detect residual current in the circuit loop having two or more conductive wires, e.g. three-phase with four conductive wires, there-phase with three conductive wires, two-phase with two conductive wires, and single-phase with two conductive wires. Since it is a symmetrical design, the residual current detection device 2*a* can be applied arbitrary through obeying the connection points of the conductive wires. In the present invention, the residual current detection device 2*a* comprises a first conductive wire 20, a second conductive wire 21, a third wire 20*a*, and a fourth wire 21*a* wherein the first conductive wire 20 and the third wire 20*a* are electrically coupled to the two conductive wires of the circuit loop 30*a* and the flowing direction is from the front end of the first and third wires 20 and 20*a* to the backend of the first and third wires 20 and 20*a* while the back end of the second and fourth wires 21 and 21*a* are connected to the two conductive wires of the circuit loop 30*a*, and the flowing direction is from the back end of the second and fourth wires 21 and 21*a* to front end of the second and fourth wires 21 and 21*a*. It is noted that since the phase difference of the multiple-phase with multiple conductive wires of AC power is hard to describe, the flowing direction is referred to the connection way comparing to the previously-described embodiments and it is referred to the electric current direction. It is noted that connection between the circuit loop 30*a* and the first to fourth wires is only an embodiment, it is not limited to the embodiment shown in FIG. 6A. Regarding the quantity of the magnetic sensor and arrangement or arrangement of the shielding structure, it is similar to the previously described embodiments, and it is not described hereinafter. It is also noted that the shape of each first to fourth conductive wires 20~21*a* is different from the previously described wires, the shape of wires in FIG. 6A could enhance the sensing capability and expand the homogeneous distribution of magnetic field, which can be utilized in the there-phase four-wired design; therefore, it is not limited to the wire shape, wire size and arrangement as described in FIG. 6A.

Figure 7A:
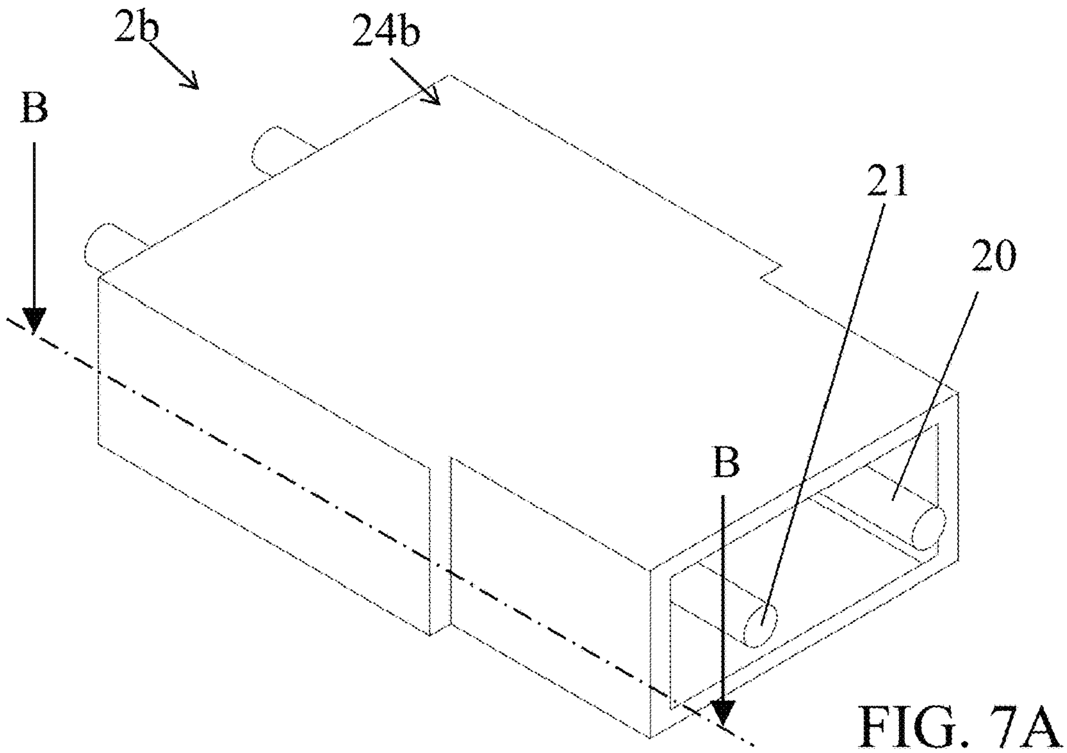
FIG. 7A and FIG. 7B illustrate perspective view and BB cross-sectional view of residual current detection device according to another embodiment of the present invention.
Figure 7B:
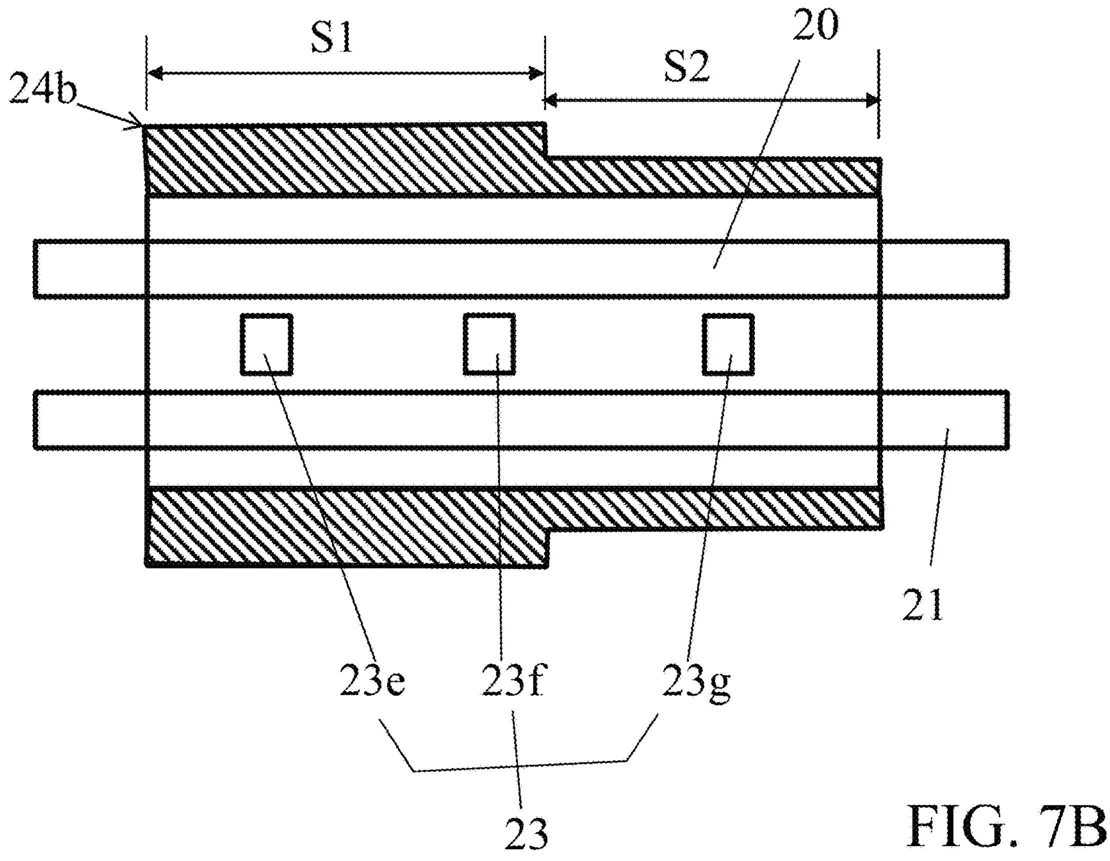
Figure 7C:
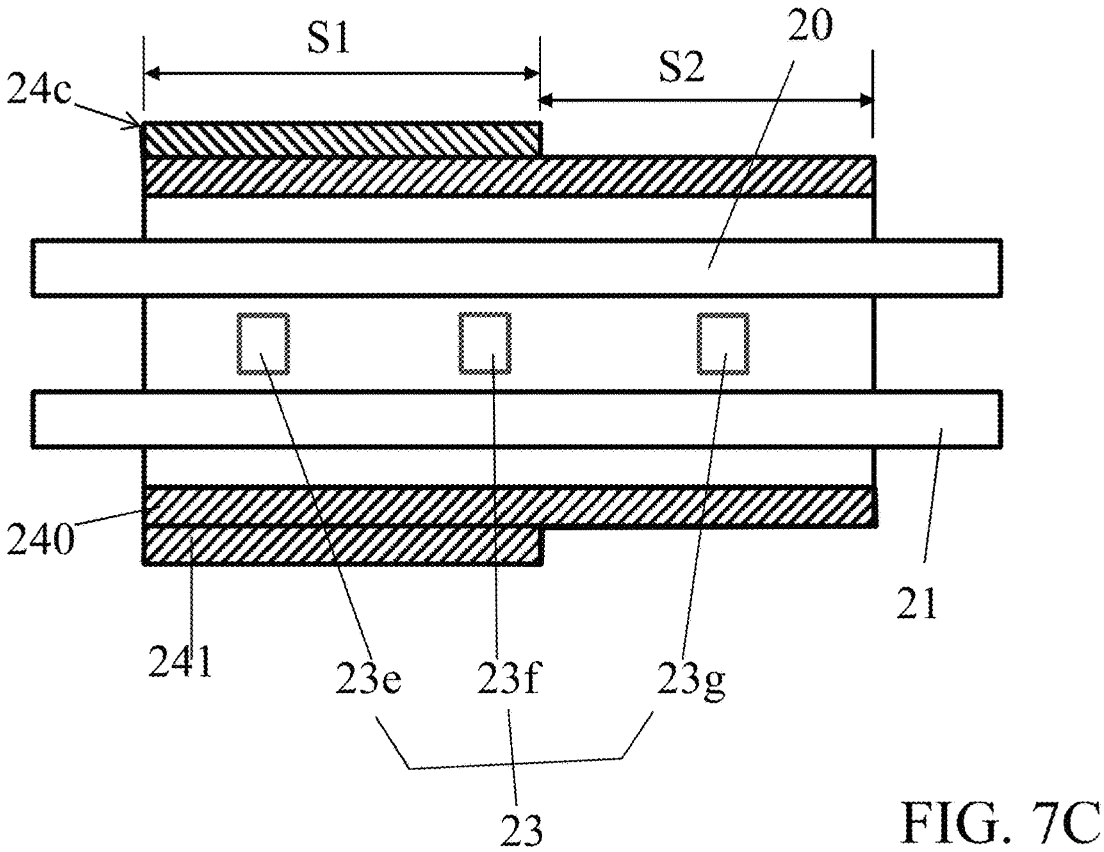
FIG. 7C illustrates a shielding structure of the residual current detection device according to another embodiment of the present embodiment.

Please refer to FIG. 7A and FIG. 7B, which illustrates perspective view and BB cross-sectional view of residual current detection device according to another embodiment of the present invention. In the present embodiment, the residual current detection device 2*b* is basically similar to the embodiments shown in FIG. 2B to FIG. 2C, and the different part is that the thickness of the first shielding structure 24*b* is varied according to the different area. In the present embodiment, the first shielding structure 24*b* comprises a first segment shielding structure S1 and a second segment shield structure S2, wherein the thickness of the first segment shielding structure S1 is different from the thickness of the second segment shielding structure S2. The magnetic sensor 23 arranged between first conductive wire 20 and second conductive wire 21 in the first shielding structure 24*b* further comprises a first magnetic sensor 23*e* and a second magnetic sensor 23*g*, wherein the thickness of shielding structure corresponding to the first magnetic sensor 23*e* and the second magnetic sensor 23*g* is different from each other. In the present embodiment, a third magnetic sensor 23*f* is further arranged between the first and second magnetic sensors 23*e* and 23*g*. The axial direction of the magnetic field detected by first magnetic sensor 23*e* and the second magnetic sensor 23*g* is the same as the axial direction of the net magnetic field detected by the third magnetic sensor 23*f*, but the accuracy and measuring range of the magnetic field detected by the first and second magnetic sensors 23*e* and 23*g* and the third magnetic sensor 23*f* are different from each other. When it comes to utilized the magnetic sensors, it is necessary to turn the magnetic sensors to the detected axial direction of magnetic field. In the present embodiment, the first and second magnetic sensors 23*e* and 23*g* are utilized to detect the second axial direction (Y) with highly accurate characteristic and the third magnetic sensor 23*f* is utilized to detect the third axial direction (Z) with large sensitive range of magnetic field. Please refer to FIG. 7C, in the present embodiment, it is basically similar to the embodiment shown in FIG. 7B, and the different part is that the first shielding structure 24*c* further comprises a first shielding layer 240 and the second shield layer 241 stacked with each other. Through the multiple layers stacked with each other, the thickness of the first segment and second segment shielding structures can be formed and adjusted, respectively. It is noted that the difference value calculated from the magnetic fields detected by the first magnetic sensor 23*e* and the second magnetic sensor 23*g* corresponding to different thickness or different material of the shielding structure could be utilized to calculate the initial shielding value. When there has no interference of external magnetic field, the difference value is almost zero. In addition, the shielding difference caused by the shielding structure having different thickness deducting the interference could also be utilized to design two shielding structures or more, e.g. the embodiments shown in FIGS. 2D~2F, or design partial area or shape along the another axial direction for generating shielding difference according to the same concept. It is noted that the present invention is not limited two or more shielded magnetic sensors.

Figure 8:
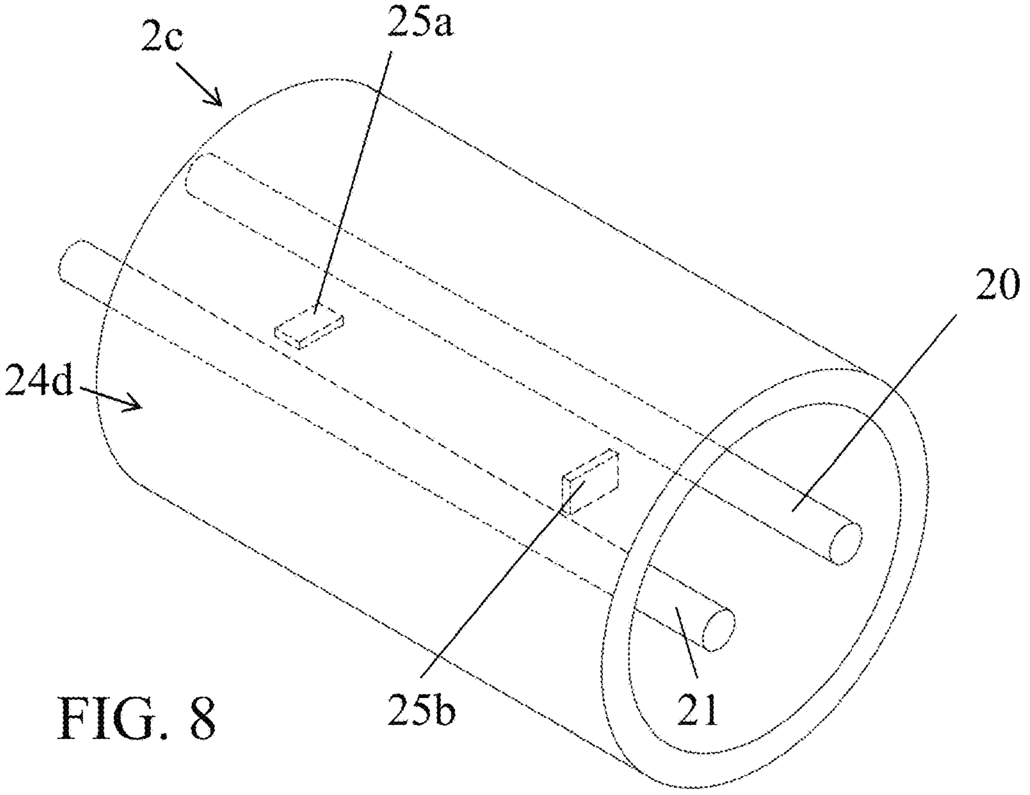
FIG. 8 illustrates a residual current detection device according to another embodiment of the present invention.

Please refer to FIG. 8, which illustrates the residual current detection device according to another embodiment of the present invention. In the present embodiment, the residual current detection device 2*c* comprises a first magnetic sensing chip 25*a* and the second magnetic sensing chip 25*b* wherein each magnetic sensing chip 25*a* or 25*b* comprises paired magnetic sensing sensors. The first magnetic sensing chip 25*a* comprises magnetic sensor for detecting small range of the magnetic field along the second axial direction (Y), which has the arrangement similar to the magnetic sensor 23 shown in FIG. 3B, i.e. magnetic sensor 23 formed by paired magnetic sensors 23*a* and 23*b*.' The second magnetic sensing chip 25*b* comprises magnetic sensor for detecting large range of the magnetic field along the third axial direction (Z), which has the arrangement similar to the magnetic sensor 23 shown in FIG. 3B, i.e. magnetic sensor 23 formed by paired magnetic sensors 23*a* and 23*b*. The arrangement of the embodiment shown in FIG. 8 can be applied to the field having measurement requirement of different magnetic field range. In the present embodiment, a shielding structure 24*d* is arranged to surround the first and second magnetic sensing chip 25*a* and 25*b*, and the first and second conductive wires 20 and 21. It is noted that an additional first magnetic sensing chip 25*a* and a plurality of second magnetic sensing chips 25*b* can be arranged between the first and second conductive wires 20 and 21 for redundancy, whereby the backup and repair for damage and erroneous analysis can be proceeded for improving the reliability of the residual current detection.

Figure 9A:
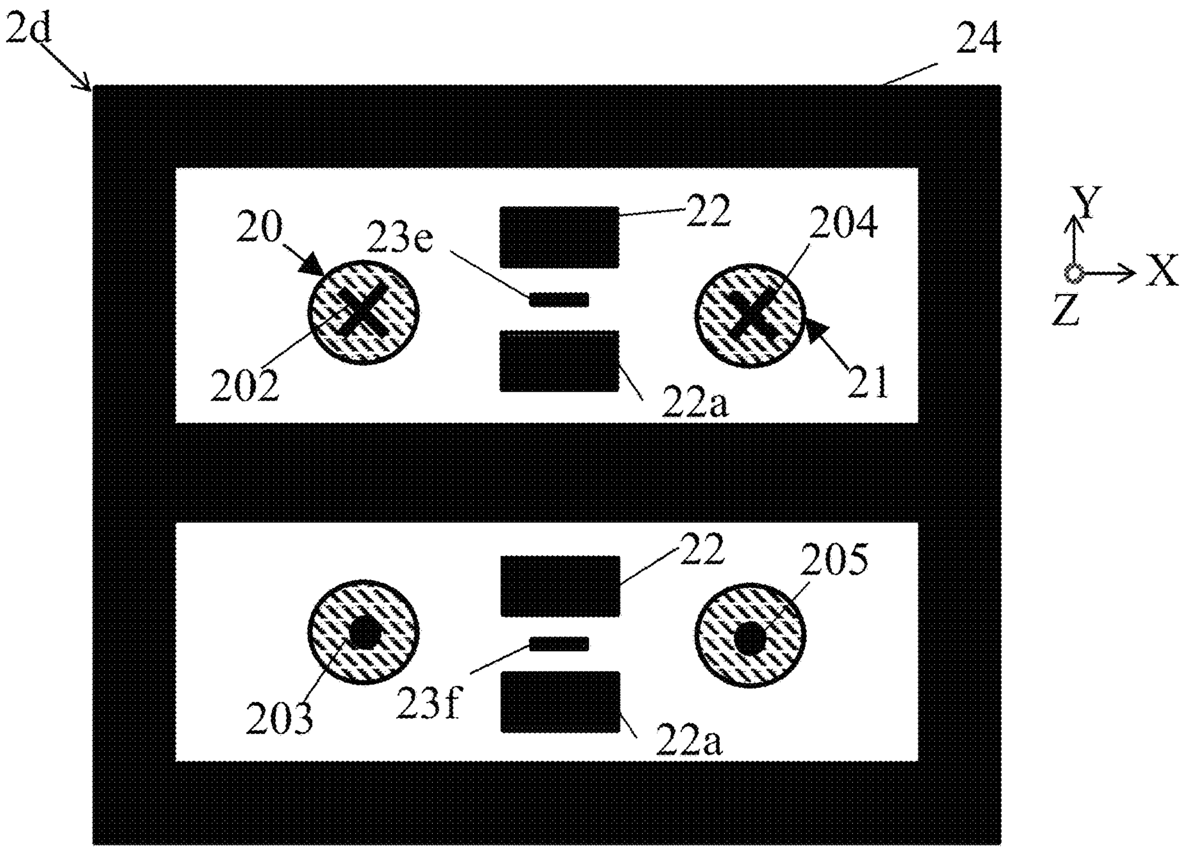
FIG. 9A and FIG. 9B illustrate residual current detection device according to another embodiment of the present invention.
Figure 9B:
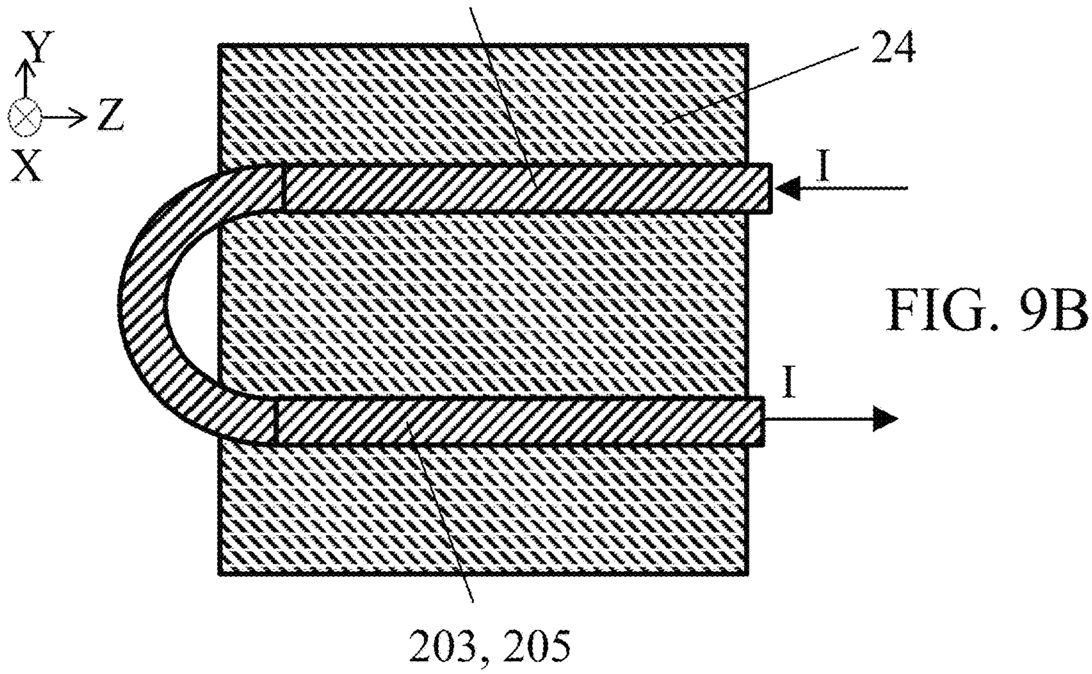
Figure 10:
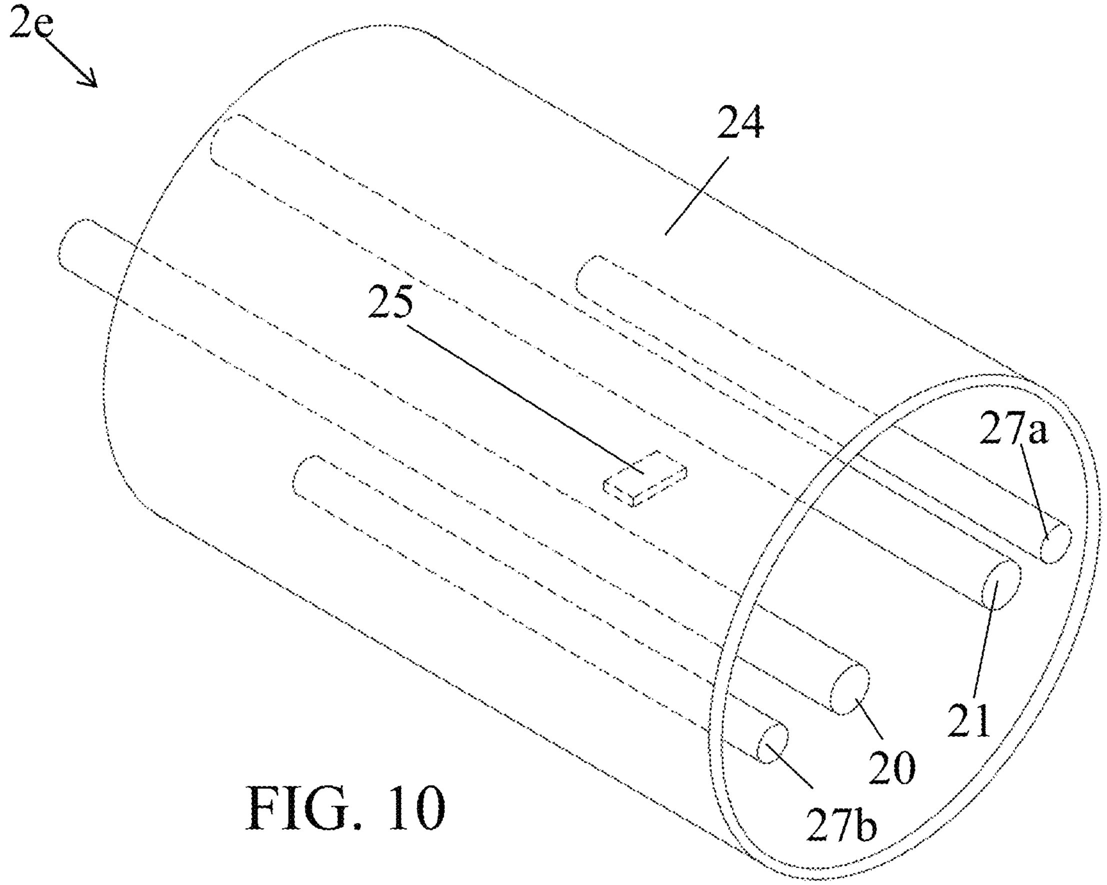
FIG. 10 illustrates residual current detection device according to another embodiment of the present invention.

Please refer to FIG. 9A and FIG. 9B, which illustrates residual current detection device according to another embodiment of the present invention. In the present invention, the first conductive wire 20 of the residual current detection device 2*d* further comprises a first sub wire 202 and second sub wire 203, and the second conductive wire 21 further comprises a third sub wire 204 and fourth sub wire 205. The magnetic sensor 23 further comprises a first magnetic sensor 23*e* and second magnetic sensor 23*f* for detecting magnetic field with respect to the second axial direction (Y), wherein the first magnetic sensor 23*e* is arranged between the first sub wire 202 and the third sub wire 204, and the second magnetic sensor 23*f* is arranged between the second sub wire 203 and the fourth sub wire 205. The first sub wire 202 is electrically coupled to the second sub wire 203, and the third sub wire 204 is electrically coupled to the fourth sub wire 205. In this embodiment, the direction of detected magnetic fields are different from the direction of the interference magnetic field, whereby the interference magnetic field could be shielded. Please refer to FIG. 10, which illustrates residual current detection device according to another embodiment of the present invention. In the present embodiment, the residual current detection device 2*e* further comprises conductive wires 27*a* and 27*b* for built-in self-test (BIST), wherein the conductive wire 27*a* is arranged between the shielding structure 24 and the first conductive wire 20, and the conductive wire 27*b* is arranged between the shield structure 24 and the second conductive wire 21.

While the present invention has been particularly shown and described with reference to a preferred embodiment, it will be understood by those skilled in the art that various changes in form and detail may be without departing from the spirit and scope of the present invention.

What is claimed is:

1. A residual current detection device, comprising:

a first conductive wire, having an electric current flowing therethrough for generating a first magnetic field;

a second conductive wire, arranged at one side of the first conductive wire, the second conductive wire having the electric current flowing therethrough for generating a second magnetic field;

a first magnetic field concentrator, arranged between the first conductive wire and the second conductive wire without almost fully surrounding the first and second conductive wires, the first magnetic field concentrator being configured to rearrange the distribution of the first and second magnetic fields such that a uniform magnetic field area having highly homogeneous magnetic field is generated between the first and second conductive wires, whereby a measurable range along an axis between the first and second conductive wires is expanded; and a magnetic sensor, arranged in the uniform magnetic field area for detecting the first magnetic field and the second magnetic field;

wherein a flowing direction that the electric current flows in the first conductive wire is the same as a flowing direction that the electric current flows in the second conductive wire, or a vector component of the flowing direction that the electric current flows in the first conductive wire is the same as a vector component of the flowing direction that the electric current flows in the second conductive wire.

2. The device of claim 1, wherein the magnetic sensor and the first magnetic field concentrator is integrated into a chip.

3. The device of claim 1, wherein the magnetic sensor further comprises a first magnetic sensor and a second magnetic sensor.

4. The device of claim 1, further comprising a second magnetic field concentrator arranged at one side of the magnetic sensor such that the magnetic sensor is arranged between the first and the second magnetic field concentrators.

5. The device of claim 4, wherein the magnetic sensor, the first magnetic field concentrator, and the second magnetic field concentrator are integrated into a chip.

6. The device of claim 4, further comprising a second magnetic field concentrator, wherein the magnetic sensor further comprises a first magnetic sensor and a second magnetic sensor, and the first and the second magnetic field concentrators are respectively arranged at two lateral sides of the first and second magnetic sensors.

7. The device of claim 1, further comprising a first shielding structure arranged to surround the first conductive wire, the second conductive wire, the first magnetic field concentrator, and the magnetic sensor proximately along a first axial direction and a second axial direction.

8. The device of claim 7, further comprising a second shielding structure arranged to surround a peripheral of the first shielding structure proximately along the first axial direction and the second axial direction.

9. The device of claim 7, further comprising a third shielding structure arranged to surround a peripheral of the first shielding structure proximately along the second axial direction and a third axial direction.

10. The device of claim 1, wherein the magnetic sensor further comprises a first magnetic sensor utilized to detect a magnetic field along a first axial direction, a second magnetic sensor utilized to detect a magnetic field along a second axial direction, and a third conductive wire and a fourth conductive wire proximately being vertical or parallel to the first and second conductive wires.

11. The device of claim 10, further comprising a second magnetic field concentrator, wherein the first and the second magnetic field concentrators are close to the second magnetic sensor.

12. The device of claim 1, wherein the magnetic sensor further comprises a pair of first magnetic sensors integrated into a first chip, and a pair of second magnetic sensors integrated into a second chip, wherein the first and second chips are respectively corresponding to different measuring range of residual current.

13. The device of claim 1, further comprising a current detector, which comprises:

a fifth conductive wire, configured to generated a fifth magnetic field;

a sixth conductive wire, arranged at one side of the fifth conductive wire for generating a sixth magnetic field;

a magnetic field sensor, arranged between the fifth conductive wire and the sixth conductive wire for detecting the fifth and the sixth magnetic fields;

wherein the first conductive wire is electrically coupled to the fifth conductive wire, the flowing direction of the electric current flowing in the first conductive wire is the same as the flowing direction of the electric current flowing in the second conductive wire, the second conductive wire is electrically coupled to the sixth wire, and a flowing direction of the electric current flowing in the fifth conductive wire is opposite to a flowing direction of the electric current flowing in the sixth conductive wire.

14. The device of claim 8, further comprising a first magnetic sensor and a second magnetic sensor arranged between the first and the second shield structures for detecting interference magnitude of an external magnetic field, wherein the first magnetic sensor and the second magnetic sensor is arranged at two lateral sides of the magnetic sensor and the interference magnitude of the external magnetic field is deducted for improving the accuracy of detection.

15. The device of claim 1, further comprising a first shielding structure is arranged to surround the first conductive wire, the second conductive wire, the first magnetic field concentrator, and the magnetic sensor, wherein the magnetic sensor further comprises a first magnetic sensor, and a second magnetic sensor, and a thickness or material of the first shielding structure corresponding to the first magnetic sensor is different from a thickness or material of the first shielding structure corresponding to the second magnetic sensor, wherein the thickness is increased through adding another shielding structure.

16. The device of claim 1, wherein the first conductive wire further comprises a first sub conductive wire and a second conductive wire, the second conductive wire further comprises a third sub conductive wire and a fourth sub conductive wire, and the magnetic sensor further comprises a first magnetic sensor and a second magnetic sensor for detecting magnetic field along a second axial direction wherein the first magnetic sensor is arranged between the first sub conductive wire and the second sub conductive wire, the second magnetic sensor is arranged between the third sub conductive wire and the fourth sub conductive wire, the first sub conductive wire is electrically coupled to the third sub conductive wire, and the second sub conductive wire is electrically coupled to the fourth sub conductive wire for shielding interference of an external magnetic field.

17. The device of claim 1, further comprising a backup magnetic sensor for redundancy, so as to proceed the backup and repair for damage and erroneous analysis.

18. The device of claim 1, further comprising a built-in self-test circuit for generating an independent magnetic field through an independent electric current for confirming if the residual current detection device is normally operated or not.

19. The device of claim 1, wherein the magnetic sensor further comprises a first magnetic sensing element, a second magnetic sensing element, a third magnetic sensing element, and a fourth magnetic sensing element for constituting a Wheatstone bridge.

* * * * *